(12) United States Patent
De Jong et al.

(10) Patent No.: US 7,916,269 B2
(45) Date of Patent: Mar. 29, 2011

(54) LITHOGRAPHIC APPARATUS AND CONTAMINATION REMOVAL OR PREVENTION METHOD

(75) Inventors: Anthonius Martinus Cornelis Petrus De Jong, Pijnacker (NL); Hans Jansen, Eindhoven (NL); Martinus Hendrikus Antonius Leenders, Rhoon (NL); Antonius Johannus Van Der Net, Tilburg (NL); Peter Franciscus Wanten, Mierlo (NL); Jacques Cor Johan Van Der Donck, Alphen aan den Rijn (NL); Robert Douglas Watso, Delevan, NY (US); Teunis Cornelis Van Den Dool, Delft (NL); Nadja Schuh, Eindhoven (NL); Jan Willem Cromwijk, Best (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/862,817

(22) Filed: Sep. 27, 2007

(65) Prior Publication Data
US 2009/0027635 A1 Jan. 29, 2009

Related U.S. Application Data

(60) Provisional application No. 60/935,037, filed on Jul. 24, 2007.

(51) Int. Cl.
*G03B 27/52* (2006.01)
*G03B 27/42* (2006.01)
*G03B 27/58* (2006.01)
*G03B 27/32* (2006.01)
*H01L 21/00* (2006.01)

(52) U.S. Cl. .............. 355/30; 355/53; 355/72; 355/77; 430/311

(58) Field of Classification Search .............. 355/30, 355/53, 72, 77; 430/311, 322; 134/94.1
See application file for complete search history.

(56) References Cited

U.S. PATENT DOCUMENTS

| | | | |
|---|---|---|---|
| 4,509,852 A | 4/1985 | Tabarelli et al. | 355/30 |
| 6,399,022 B1 | 6/2002 | Schuler et al. | |
| 6,496,257 B1 | 12/2002 | Taniguchi et al. | 356/239.2 |
| 7,050,146 B2 | 5/2006 | Duineveld et al. | 355/30 |
| 7,091,502 B2 | 8/2006 | Gau et al. | 250/492.2 |
| 7,179,440 B2 * | 2/2007 | Escrig et al. | 423/584 |
| 7,224,427 B2 | 5/2007 | Chang et al. | 355/30 |
| 7,224,434 B2 | 5/2007 | Tokita | 355/53 |
| 7,307,263 B2 | 12/2007 | Bakker et al. | 250/492.2 |

(Continued)

FOREIGN PATENT DOCUMENTS

CN 1963673 5/2007

(Continued)

OTHER PUBLICATIONS

English Translation of JP 2007-150102 (dated Jun. 14, 2007).*

(Continued)

*Primary Examiner* — Alan A Mathews
(74) *Attorney, Agent, or Firm* — Pillsbury Winthrop Shaw Pittman LLP

(57) ABSTRACT

An immersion lithographic apparatus is cleaned by use of a cleaning liquid consisting essentially of ultra-pure water and (a) a mixture of hydrogen peroxide and ozone, or (b) hydrogen peroxide at a concentration of up to 5%, or (c) ozone at a concentration of up to 50 ppm, or (d) oxygen at concentration of up to 10 ppm, or (e) any combination selected from (a)-(d).

12 Claims, 7 Drawing Sheets

U.S. PATENT DOCUMENTS

| | | | |
|---|---|---|---|
| 7,315,033 B1 | 1/2008 | Pawloski et al. | |
| 7,385,670 B2 | 6/2008 | Compen et al. | 355/30 |
| 7,405,417 B2 | 7/2008 | Stevens et al. | 250/504 R |
| 7,462,850 B2 | 12/2008 | Banine et al. | 250/504 R |
| 2004/0136494 A1 | 7/2004 | Lof et al. | 378/34 |
| 2004/0207824 A1 | 10/2004 | Lof et al. | 355/30 |
| 2005/0024609 A1 | 2/2005 | De Smit et al. | 355/18 |
| 2005/0074704 A1 | 4/2005 | Endo et al. | |
| 2005/0175776 A1 | 8/2005 | Streefkerk et al. | 427/256 |
| 2005/0185155 A1 | 8/2005 | Kishikawa | 355/30 |
| 2005/0264774 A1 | 12/2005 | Mizutani et al. | 355/30 |
| 2005/0274898 A1 | 12/2005 | Watanabe et al. | 250/372 |
| 2006/0023185 A1 | 2/2006 | Hazelton et al. | 355/53 |
| 2006/0038968 A1 | 2/2006 | Kemper et al. | 355/18 |
| 2006/0050351 A1 | 3/2006 | Higashiki | 359/228 |
| 2006/0103813 A1 | 5/2006 | Niwa et al. | 353/84 |
| 2006/0103818 A1 | 5/2006 | Holmes et al. | 355/53 |
| 2006/0107976 A1 | 5/2006 | Boyers | |
| 2006/0132731 A1 | 6/2006 | Jansen et al. | 355/30 |
| 2006/0158627 A1 | 7/2006 | Kemper et al. | 355/53 |
| 2006/0232757 A1 | 10/2006 | Tani et al. | 355/53 |
| 2006/0250588 A1 | 11/2006 | Brandl | 355/30 |
| 2006/0256316 A1 | 11/2006 | Tanno et al. | 355/72 |
| 2007/0002296 A1 | 1/2007 | Chang et al. | 355/53 |
| 2007/0004182 A1 | 1/2007 | Chang et al. | 438/478 |
| 2007/0026345 A1 | 2/2007 | Subramanian et al. | 430/311 |
| 2007/0064215 A1 | 3/2007 | Dirksen et al. | 355/77 |
| 2007/0076197 A1 | 4/2007 | Koga | 356/237.3 |
| 2007/0085989 A1 | 4/2007 | Nagahashi et al. | 355/53 |
| 2007/0091287 A1* | 4/2007 | Chang et al. | 355/30 |
| 2007/0127001 A1 | 6/2007 | Van Der Hoeven | 355/53 |
| 2007/0146657 A1 | 6/2007 | Van Mierlo et al. | 353/30 |
| 2007/0146658 A1 | 6/2007 | Van Mierlo et al. | 353/30 |
| 2007/0159610 A1 | 7/2007 | Shiraishi | 355/53 |
| 2007/0172234 A1 | 7/2007 | Shigemori et al. | 396/611 |
| 2007/0206279 A1 | 9/2007 | Brueck et al. | 359/391 |
| 2007/0229789 A1 | 10/2007 | Kawamura | 355/53 |
| 2007/0247600 A1 | 10/2007 | Kobayashi et al. | 355/30 |
| 2007/0251543 A1 | 11/2007 | Singh | 134/1 |
| 2007/0253710 A1 | 11/2007 | Kaneyama et al. | 396/611 |
| 2007/0258072 A1 | 11/2007 | Nagasaka et al. | |
| 2007/0274711 A1 | 11/2007 | Kaneyama et al. | 396/611 |
| 2007/0285631 A1 | 12/2007 | Stavenga et al. | 355/30 |
| 2007/0291239 A1* | 12/2007 | Shiraishi | 355/30 |
| 2008/0002162 A1 | 1/2008 | Jansen et al. | 355/30 |
| 2008/0049201 A1 | 2/2008 | Stavenga et al. | 355/30 |
| 2008/0218712 A1 | 9/2008 | Compen et al. | 355/30 |
| 2008/0273181 A1 | 11/2008 | De Jong et al. | 355/30 |
| 2008/0284990 A1 | 11/2008 | De Jong et al. | 355/30 |
| 2009/0025753 A1 | 1/2009 | De Jong et al. | 134/10 |
| 2009/0027636 A1 | 1/2009 | Leenders et al. | 355/30 |

FOREIGN PATENT DOCUMENTS

| | | |
|---|---|---|
| EP | 1 420 298 | 5/2004 |
| EP | 1 420 300 | 5/2004 |
| EP | 1 628 163 | 2/2006 |
| EP | 1 777 589 A2 | 4/2007 |
| EP | 1 783 821 A1 | 5/2007 |
| EP | 1 783 822 A1 | 5/2007 |
| EP | 1 793 276 A2 | 6/2007 |
| EP | 1 895 571 | 3/2008 |
| JP | 2000-323396 | 11/2000 |
| JP | 2005-072404 | 3/2005 |
| JP | 2005-079222 | 3/2005 |
| JP | 2006-134999 | 5/2006 |
| JP | 2006-310706 | 11/2006 |
| JP | 2007-029973 | 2/2007 |
| JP | 2007-088328 | 4/2007 |
| JP | 2007-142217 | 6/2007 |
| JP | 2007-150102 A | 6/2007 |
| JP | 2007-227543 | 9/2007 |
| JP | 2007-227580 | 9/2007 |
| WO | WO 99/49504 | 9/1999 |
| WO | WO 2005/122218 | 12/2005 |
| WO | WO 2006/041086 | 4/2006 |
| WO | WO 2006/062065 | 6/2006 |
| WO | WO 2006/122578 | 11/2006 |
| WO | WO 2006/137410 | 12/2006 |
| WO | WO 2007/006447 | 1/2007 |
| WO | WO 2007/135990 | 11/2007 |
| WO | WO 2007/136089 | 11/2007 |
| WO | WO 2008/001871 | 1/2008 |

OTHER PUBLICATIONS

Chang, Ching Yu, et al., "Development of Cleaning Process for Immersion Lithography", Optical Microlithography XIX, Proc. of SPIE vol. 6154, 2006, pp. 61544R-1-61544R11.

Al-Kdasi, Adel, et al., "Treatment of Textile Wastewater by Advanced Oxidation Processes—A Review", Global Nest: the Int. J. vol. 6, No. 3, 2004, pp. 222-230.

Chen, Gim S., "The Application of Di-$O_3$ Water on Wafer Surface Preparation", AKrion, LLC, 2000.

Ledakowicz, Stanislaw, et al., "Oxidation of PAHs in water solutions by ultraviolet radiation combined with hydrogen peroxide", International Journal of Photoenergy, vol. 1, 1999, pp. 1-6.

Extended Search Report issued for European Patent Application No. 08252507.2, dated Dec. 3, 2008.

Duineveld et al. (Reissue Application of U.S. Patent No. 7,050,146 B1), U.S. Appl. No. 12/153,717, filed May 22, 2008.

Kadijk et al., U.S. Appl. No. 12/233,000, filed Sep. 26, 2008.

Streefkerk et al., U.S. Appl. No. 12/237,557, filed Sep. 25, 2008.

De Jong et al., U.S. Appl. No. 12/289,621, filed Oct. 30, 2008.

De Jong et al., U.S. Appl. No. 12/314,611, filed Dec. 12, 2008.

De Graaf et al., U.S. Appl. No. 12/318,037, filed Dec. 19, 2008.

De Jong, U.S. Appl. No. 12/358,000, filed Jan. 22, 2009.

* cited by examiner

Fig. 2
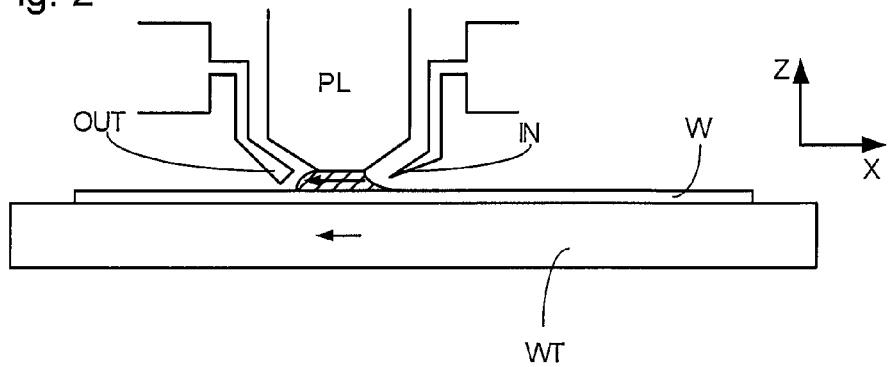
Fig. 3
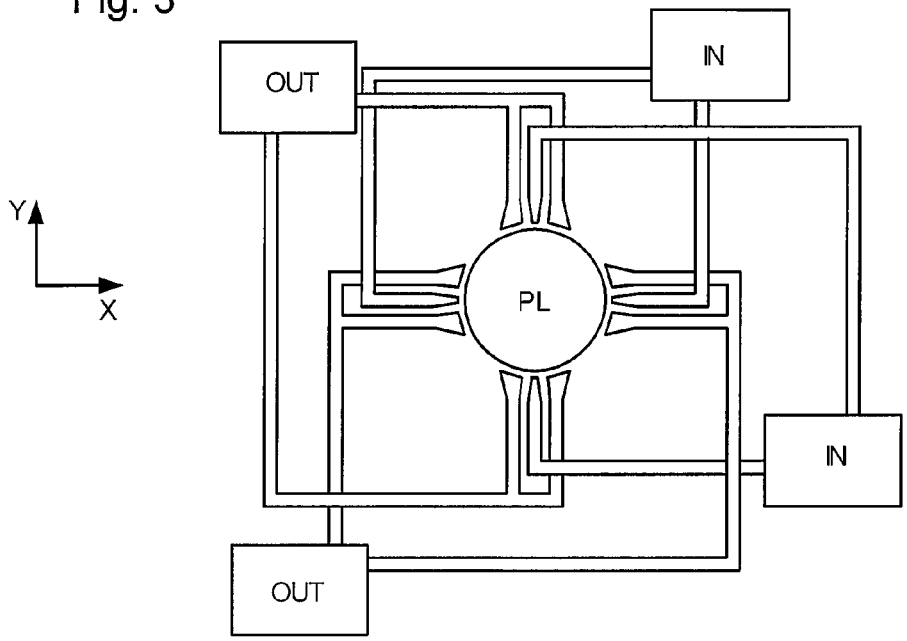
Fig. 4
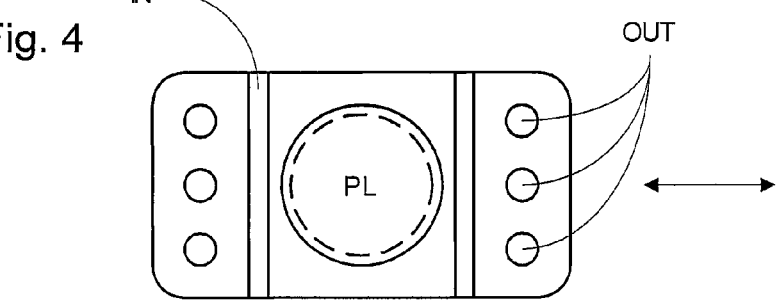
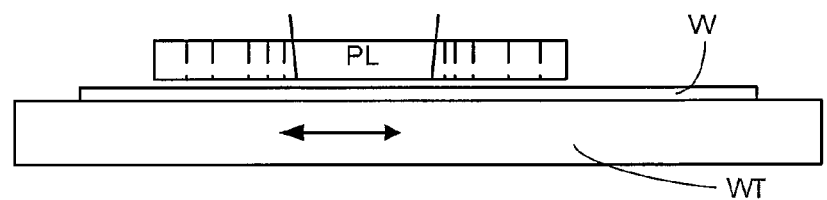

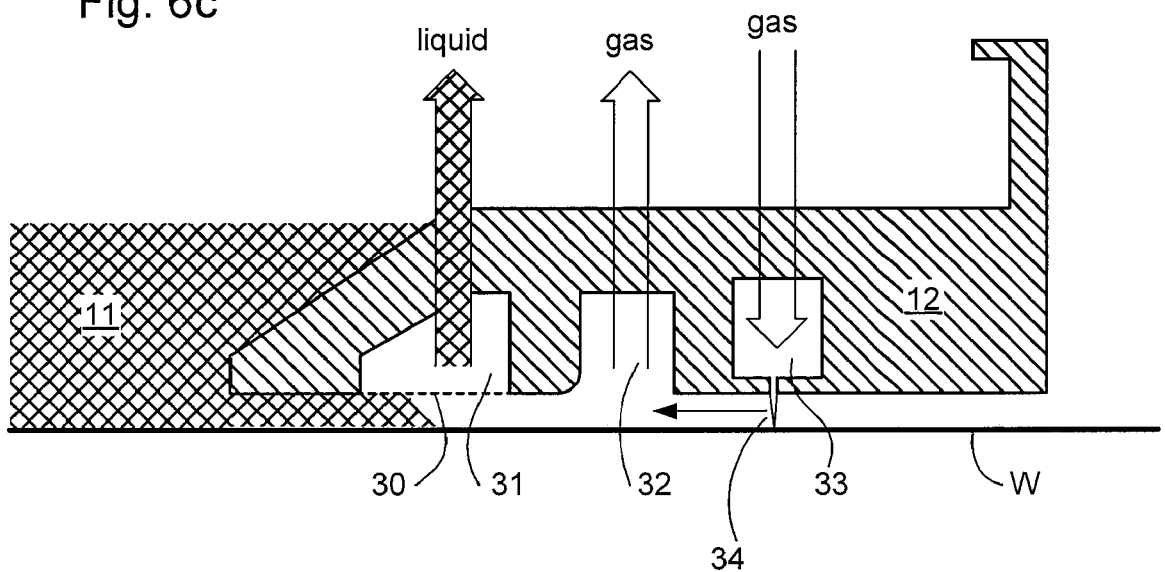

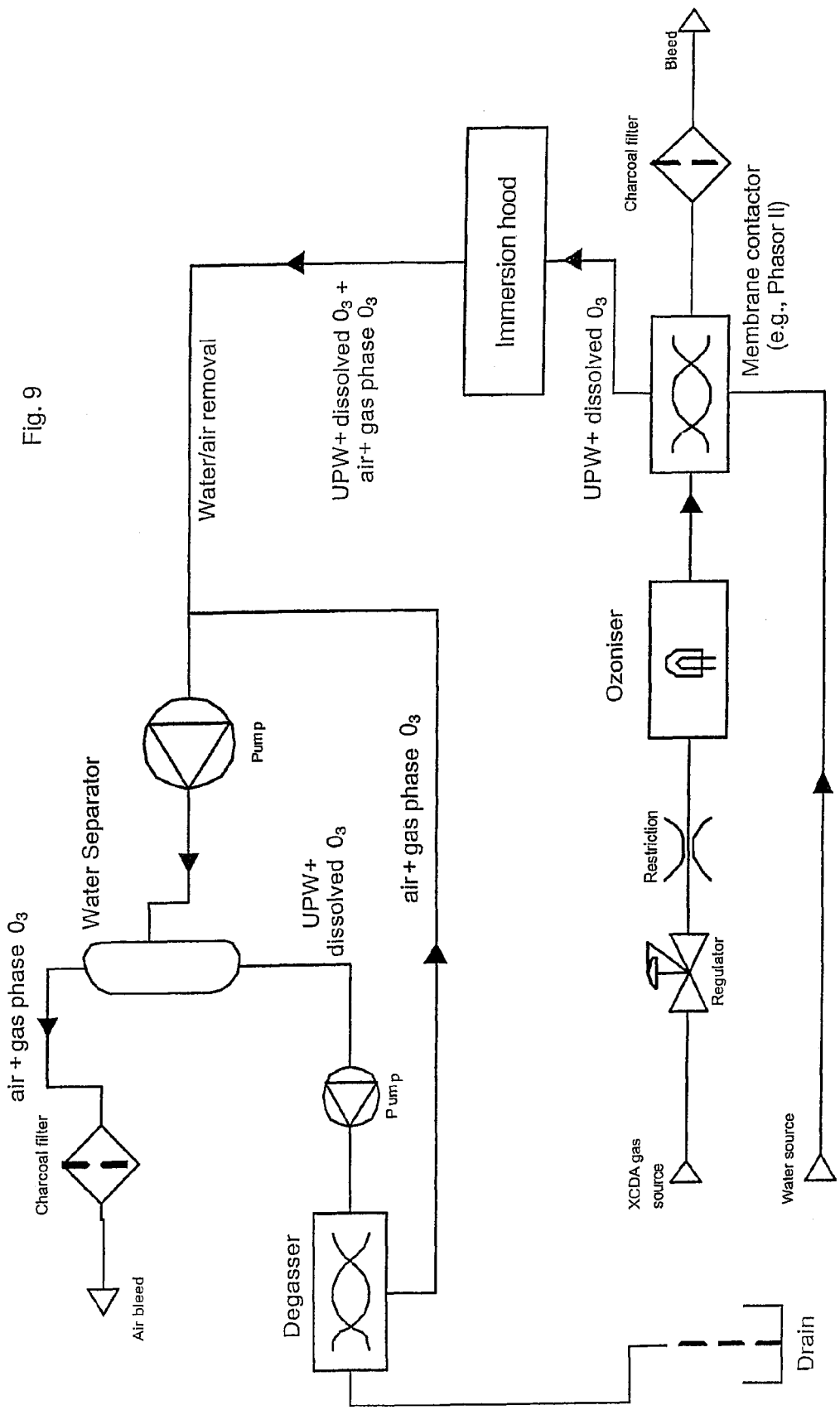

LITHOGRAPHIC APPARATUS AND CONTAMINATION REMOVAL OR PREVENTION METHOD

This application claims priority and benefit to U.S. Provisional Patent Application Ser. No. 60/935,037, entitled "LITHOGRAPHIC APPARATUS AND CONTAMINATION REMOVAL OR PREVENTION METHOD", filed on Jul. 24, 2007. The content of that application is incorporated herein in its entirety by reference.

FIELD

The present invention relates to a lithographic apparatus and a method for removing or preventing contamination in a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

There is a need to address the issue of contamination in a lithographic apparatus, such as the contamination generated by removal of particles of top-coat material, resist or both. Current cleaning methods generally do not allow for in-line cleaning, and accordingly their completion causes significant down-time of the apparatus.

SUMMARY

An effective cleaning method can involve the use of an organic solvent or other highly oxidizing cleaning material such as ozone. The use of such a highly corrosive cleaning agent may cause a considerable risk of damage to component surfaces, and it may therefore be desirable to minimize or avoid their use entirely in order to limit the resulting damage. Further, a cleaning material may leave a deposit on the surface to which it is exposed and the deposit may need to be removed before the apparatus can be used. Rinsing to remove such a deposit should be thorough and therefore takes time. This may be particularly difficult with an organic cleaning solvent which is not easily removed by rinsing with, for example, water.

The use of ozone may also cause particular difficulty, not least of which is the extremely hazardous nature of ozone which leads to safety concerns when handling the material. Removal of ozone after its use should also be thorough and adds to the cost and complication of the cleaning method. A commercially available ozonizer may be unsuitable since it produces hydrogen gas, which is dangerous. Further, many commercial processes produce too many impurities to be useful in the ultra-high purity environment which is needed.

Where ultraviolet (UV) radiation is used to activate the ozone to more reactive hydroxyl radicals, additional cleaning effect can be generated. However, the radicals are themselves very short-lived and are substantially only present within the spot of UV radiation. The use of multiple radiation sources or multiple mirrors to ensure that all parts of the apparatus are cleaned may be impractical.

It is desirable, for example, to provide an improved technique for dealing with contamination in an immersion type projection apparatus which may address one or more of the problems discussed above.

According to an aspect of the invention, there is provided an immersion type lithographic apparatus comprising: an immersion system configured to at least partially fill an immersion space with an immersion liquid; a cleaning liquid supply system configured to provide a cleaning liquid to the immersion space; and a cleaning liquid which is contained in the immersion space and/or in the cleaning liquid supply system; wherein the cleaning liquid consists essentially of ultra-pure water and (a) a mixture of hydrogen peroxide and ozone, or (b) hydrogen peroxide at a concentration of up to 10%, or (c) ozone at a concentration of up to 50 ppm, or (d) oxygen at concentration of up to 10 ppm, or (e) any combination selected from (a)-(d).

The cleaning liquid supply system may be part of the immersion liquid supply system. The immersion liquid supply system is used to supply immersion fluid during immersion. The cleaning liquid supply system may be totally or partially separate from the immersion liquid supply system.

According to another aspect of the invention, there is provided a method for preventing or reducing contamination in an immersion type lithographic apparatus, the apparatus comprising an immersion system configured to at least partially fill an immersion space with an immersion liquid, the method comprising supplying a cleaning liquid to the immersion space, wherein the cleaning liquid consists essentially of ultra-pure water and (a) a mixture of hydrogen peroxide and ozone, or (b) hydrogen peroxide at a concentration of up to 5%, or (c) ozone at a concentration of up to 50 ppm, or (d) oxygen at concentration of up to 10 ppm, or (e) any combination selected from (a)-(d).

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts a further liquid supply system for use in a lithographic projection apparatus;

FIGS. 6a-c depict a liquid removal device;

FIG. 9 depicts an in situ ozone generation system according to an embodiment of the invention;

DETAILED DESCRIPTION

Figure 1:
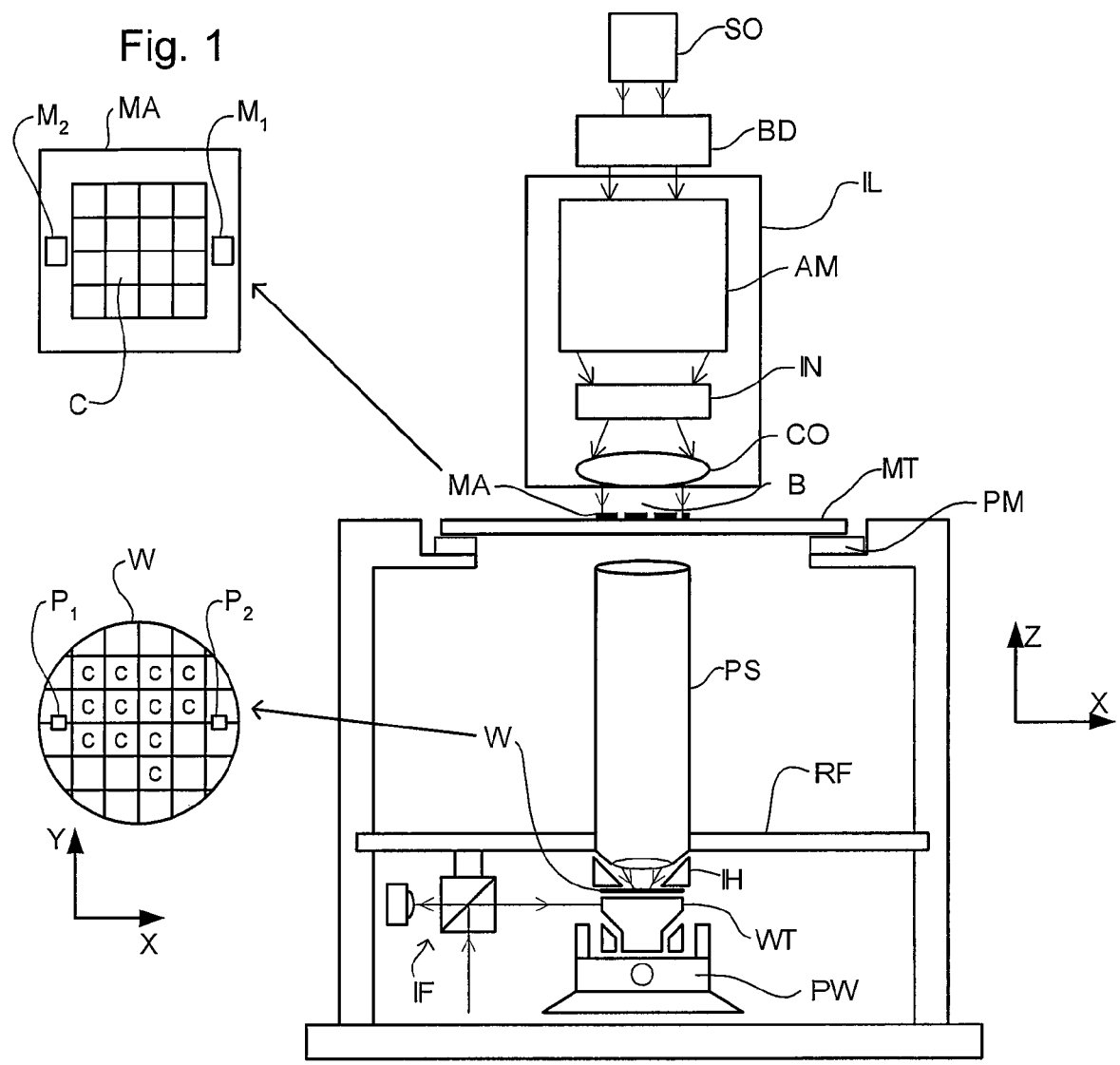
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support structure holds the patterning device in a manner that depends on the orientation of the patterning device, the design of the lithographic apparatus, and other conditions, such as for example whether or not the patterning device is held in a vacuum environment. The patterning device support structure can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device support structures). In such "multiple stage" machines the additional tables and/or support structures may be used in parallel, or preparatory steps may be carried out on one or more tables and/or support structures while one or more other tables and/or support structures are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the patterning device support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the patterning device support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support structure MT and the substrate table WT are scanned synchronously while a pattern imparted to the radiation beam is projected onto a target portion C (i.e. a single dynamic exposure). The velocity and direction of the substrate table WT relative to the patterning device support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

An immersion lithography solution with a localized liquid supply system IH is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the beam of radiation is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
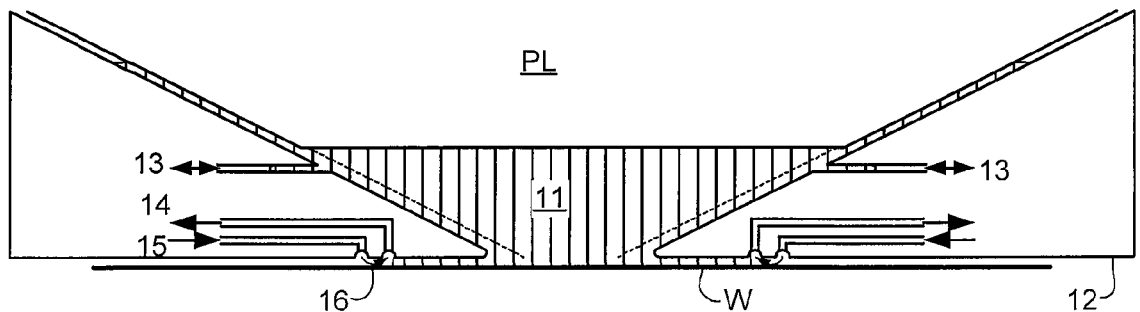
FIG. 5 depicts a further liquid supply system.

Another immersion lithography solution with a localized liquid supply system solution which has been proposed is to provide the liquid supply system with a liquid confinement structure (or so-called immersion hood IH) which extends along at least a part of a boundary of the space between the final element of the projection system and the substrate table. Such a solution is illustrated in FIG. 5. The liquid confinement structure is substantially stationary relative to the projection system in the XY plane though there may be some relative movement in the Z direction (in the direction of the optical axis). A seal may be formed between the liquid confinement structure and the surface of the substrate. In an embodiment, the seal is a contactless seal such as a gas seal.

Referring to FIG. 5, liquid confinement structure 12 forms a contactless seal to the substrate around the image field of the projection system so that liquid is confined to fill an immersion space or reservoir 11 between the substrate surface and the final element of the projection system. The reservoir 11 is at least partly formed by the liquid confinement structure 12 positioned below and surrounding the final element of the projection system PL. Liquid is brought into the space below the projection system and within the liquid confinement structure 12. Liquid may be brought into the space and/or removed from the space by liquid inlet 13. The liquid confinement structure 12 extends a little above the final element of the projection system and the liquid level rises above the final element so that a buffer of liquid is provided. The liquid confinement structure 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 formed between the bottom of the liquid confinement structure 12 and the surface of the substrate W. The gas seal is formed by gas, e.g. air or synthetic air or $N_2$ or an inert gas, provided under pressure via inlet 15 to the gap between liquid confinement structure 12 and substrate and extracted via outlet 14. The overpressure on the gas inlet 15, vacuum level on the outlet 14 and geometry of the gap are arranged so that there is a high-velocity gas flow inwards that confines the liquid. The inlet and/or outlet may be annular grooves which surround the space 11. The groove may be continuous or discontinuous. Such a system is disclosed in United States patent application publication no. US 2004-0207824.

In European patent application publication no. EP 1,420, 300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Figure 6A:
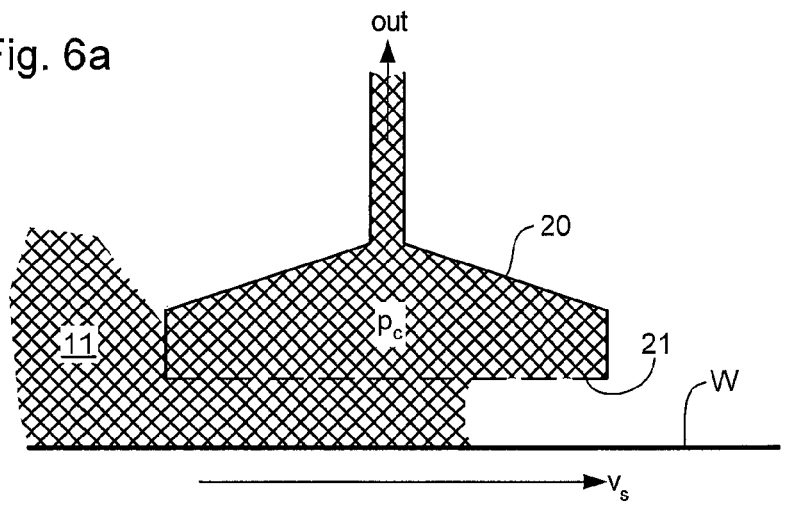
Figure 6B:
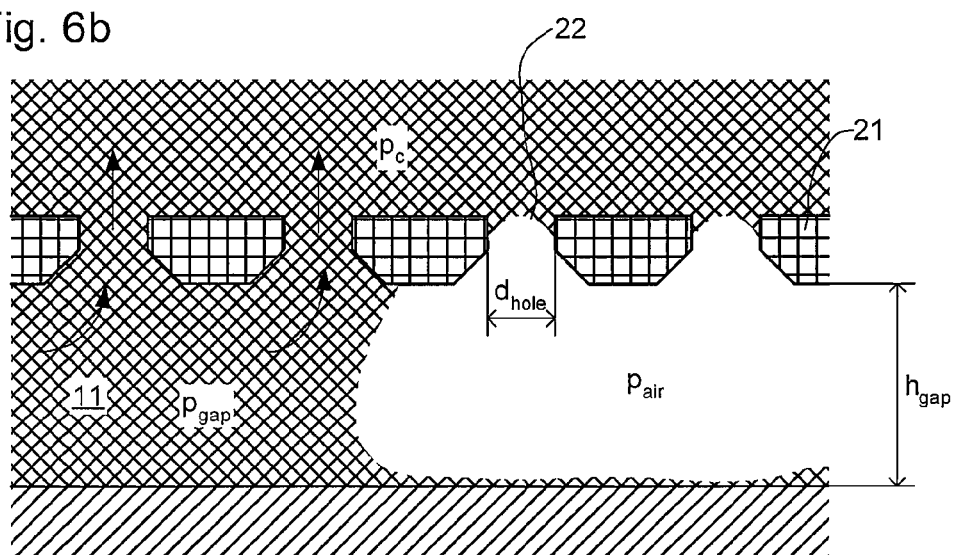

FIGS. 6a and 6b, the latter of which is an enlarged view of part of the former, illustrate a liquid removal device 20 which may be used in an immersion system to remove liquid between the immersion hood IH and the substrate W. The liquid removal device 20 comprises a chamber which is maintained at a slight underpressure $p_c$ and is filled with the immersion liquid. The lower surface of the chamber is formed of a porous member 21, for example a perforated plate or a thin plate 21 having a large number of small holes, e.g. of diameter $d_{hole}$ in the range of 5 μm to 50 μm. The lower surface is maintained at a gap height $h_{gap}$ of less than 1 mm, desirably in the range of 50 μm to 300 μm above a surface from which liquid is to be removed, e.g. the surface of a substrate W. In an embodiment, porous member 21 is at least slightly liquidphilic (i.e., for water, hydrophilic), i.e. having a contact angle of less than 90° to the immersion liquid, e.g. water.

The underpressure $p_c$ is such that the menisci 22 formed in the holes in the porous member 21 substantially prevent gas being drawn into the chamber of the liquid removal device. However, when the porous member 21 comes into contact with liquid on the surface W there is no meniscus to restrict flow and the liquid can flow freely into the chamber of the liquid removal device. Such a device can remove most of the liquid from the surface of a substrate W, though a thin film of liquid may remain, as shown in the drawings.

To improve or maximize liquid removal, the porous member 21 should be as thin as possible and the pressure differential between the pressure in the liquid $p_{gap}$ and the pressure in the chamber $p_c$ should be as high as possible, while the pressure differential between $p_c$ and the pressure of the gas in the gap $p_{air}$ must be low enough to prevent a significant amount of gas being drawn into the liquid removal device 20.

It may not always be possible to prevent gas being drawn into the liquid removal device but the porous member will prevent large uneven flows that may cause vibration. Micro-sieves made by electroforming, photo-etching and/or laser cutting can be used as the porous member 21. Suitable sieves are made by Stork Veco B.V., of Eerbeek, the Netherlands. Other porous plates or solid blocks of porous material may also be used, provided the pore size is suitable to maintain a meniscus with the pressure differential that will be experienced in use.

Such a liquid removal device can be incorporated into many types of liquid confinement structure 12 and/or immersion hood IH. One example is illustrated in FIG. 6c as disclosed in United States patent application publication no. US 2006-0038968. FIG. 6c is a cross-sectional view of one side of the liquid confinement structure 12, which forms a ring (as used herein, a ring may be circular, rectangular or any other shape) at least partially around the exposure field of the projection system PS (not shown in FIG. 6c). In this embodiment, the liquid removal device 20 is formed by a ring-shaped chamber 31 near the innermost edge of the underside of the liquid confinement structure 12. The lower surface of the chamber 31 is formed by a porous plate 30, as described above. Ring-shaped chamber 31 is connected to a suitable pump or pumps to remove liquid from the chamber and maintain the desired underpressure. In use, the chamber 31 is full of liquid but is shown empty here for clarity.

Outward of the ring-shaped chamber 31 are a gas extraction ring 32 and a gas supply ring 33. The gas supply ring 33 has a narrow slit in its lower part and is supplied with gas, e.g. air, artificial air or flushing gas, at a pressure such that the gas escaping out of the slit forms a gas knife 34. The gas forming the gas knife is extracted by a suitable vacuum pump connected to the gas extraction ring 32 so that the resulting gas flow drives any residual liquid inwardly where it can be removed by the liquid removal device and/or the vacuum pump, which should be able to tolerate vapor of the immersion liquid and/or small liquid droplets. However, since the majority of the liquid is removed by the liquid removal device 20, the small amount of liquid removed via the vacuum system does not cause an unstable flow which may lead to vibration.

While the chamber 31, gas extraction ring 32, gas supply ring 33 and other rings are described as rings herein, it is not necessary that they surround the exposure field or be complete. In an embodiment, such inlet(s) and outlet(s) may simply be circular, rectangular or other type of elements extending partially along one or more sides of the exposure field, such as for example, shown in FIGS. 2, 3 and 4.

In the apparatus shown in FIG. 6c, most of the gas that forms the gas knife is extracted via gas extraction ring 32, but some gas may flow into the environment around the immersion hood and potentially disturb the interferometric position measuring system IF. This can be prevented by the provision of an additional gas extraction ring outside the gas knife.

Further examples of how such a single phase extractor can be used in an immersion hood or liquid confinement system or liquid supply system can be found, for example in European patent application publication no. EP 1,628,163 and United States patent application publication no. US 2006-0158627. In most applications the porous member will be on an underside of the liquid supply system and the maximum speed at which the substrate W can move under the projection system PS is in at least part determined by the efficiency of removal of liquid through the porous member 21. One difficulty is that some of the holes may become blocked by debris, such as resist which has lifted off from a substrate during imaging.

This may reduce the maximum speed at which the substrate can be moved without leaking of liquid from the liquid supply system or immersion hood.

With reference to FIG. 1, the lithographic apparatus of an embodiment of the invention comprises an immersion system having an immersion space defined by the substrate table WT or, when present the substrate W, the immersion hood IH and the projection system PS. Contamination of one or more of the surfaces of the immersion space, such as a surface of the immersion hood and/or of the substrate table WT, builds up over time if not removed. A cleaning liquid may be supplied to the immersion space in order to help prevent the build up of such contamination, and to remove contamination present on the inner surfaces of the immersion space.

A cleaning liquid according to an embodiment of the invention consists of or consists essentially of a water-soluble cleaning component, in particular contains only or substantially only (in an embodiment, oxidizing) a component made up of the elements hydrogen H and oxygen O. This material has an effective cleaning action to remove contamination, and yet there is a reduced likelihood of damage being caused to the apparatus. Deposits of cleaning material may be avoided or reduced. Further, rinsing with, for example, water after cleaning is simple and rapid. The cleaning system of an embodiment of the invention therefore may provide a simple and quick in-line cleaning process which may be completed within a maximum time of an hour.

A cleaning liquid according to an embodiment of the invention is typically a very dilute solution. Such a solution may be effective at removing contamination, while reducing the amount of deposits or drying stains which occur with the use of higher concentration. A dilute solution is also much safer to handle and less likely to cause damage to the surfaces of the apparatus. Ultra-pure water rinsing after cleaning may be reduced in time, thereby decreasing the downtime of the apparatus.

In an embodiment, the cleaning liquid consists of or consists essentially of ultra-pure water containing hydrogen peroxide and ozone (peroxone). The combination of hydrogen peroxide and ozone is a reactive mixture which will in part spontaneously react to produce the highly oxidizing species OH (hydroxyl radical). This combination is advantageous since the OH radical can be produced without the application of UV radiation. All wetted surfaces of the immersion space may therefore be cleaned, and cleaning is not limited to surfaces which can be exposed to UV radiation. Cleaning with peroxone is effective for many types of contamination which can be difficult to remove with weaker cleaning agents.

Typical concentrations of ozone in the cleaning liquid are from 0.1 ppm to 20 ppm, for example at least 1 ppm, 2 ppm or at least 5 ppm. The maximum concentration of ozone is typically 15 ppm or 12 ppm. About 10 ppm is desirable. Typical concentrations of hydrogen peroxide in the cleaning liquid are from 0.1 ppm to 10 ppm, for example at least 0.5 ppm or at least 1 ppm. The maximum concentration of hydrogen peroxide is typically 8 ppm or 5 ppm. About 2 ppm hydrogen peroxide is desirable. The peroxone mixture may be more effective when used with a ratio by concentration of hydrogen peroxide to ozone of 0.2:1 to 0.5:1. In an embodiment, the concentration of the components of the mixture are 2.5 ppm hydrogen peroxide and 10 ppm ozone.

In an embodiment, the cleaning liquid contains hydrogen peroxide alone. This cleaning liquid is also effective without the application of UV radiation and therefore cleans all wetted surfaces. Cleaning with hydrogen peroxide is particularly effective for removing flakes or other particles originating from the organic process layers present on a substrate, e.g. resist and topcoat. Hydrogen peroxide is also a relatively safe and simple material to handle and is less corrosive to component surfaces than other more oxidizing materials. Suitable concentrations of hydrogen peroxide when used alone are up to 10%, in an embodiment from 0.1% to 5%. Typically, the maximum concentration used is 2%.

In an embodiment, the cleaning liquid contains ozone. The ozone may be generated in situ as described below, or an external ozone source may be used. Concentrations of ozone may be from 1 ppm to 50 ppm, for example up to 20 ppm or up to 10 ppm.

In an embodiment, the cleaning liquid contains oxygen. In this aspect, the cleaning liquid should desirably be irradiated with UV radiation as described below. The concentrations of oxygen in the cleaning liquid may be up to 10 ppm, for example up to 5 ppm or up to 2 ppm. The maximum oxygen concentration is the maximum oxygen saturation using atmospheric air. A gas mixture enriched with oxygen may be used, which achieves a higher saturation level. Using an oxygen enriched gas mixture, a concentration of up to 50 ppm may be achieved. The use of oxygen as the cleaning agent is highly beneficial from a safety point of view. Further, oxygen can be activated into more oxidizing cleaning species such as ozone in situ, by application of UV radiation. Consequently, effective cleaning may be achieved, including the removal of contaminants such as partly carbonized materials which can be difficult to remove with known cleaning agents.

The cleaning liquid may be supplied to the immersion space, for example by flushing the cleaning liquid through the immersion space. Thus, a continuous flow of cleaning liquid through the immersion space may be used. The flushing process may be continued for any desired length of time, but it is envisaged that flushing for, e.g., up to half an hour, for example 15 minutes, up to 10 minutes or even up to 5 minutes would be sufficient to provide a cleaning effect. The cleaning fluid may additionally or alternatively be supplied to the immersion space and held in the space for a period of time (e.g. up to 15 minutes, 10 minutes or 5 minutes), before being flushed or pumped out. This process may be repeated one or more times.

Following cleaning, the immersion space is generally rinsed with ultra-pure water. An advantage of one or more of the cleaning liquids described herein is the ease of removing all traces of the cleaning liquid by rinsing with ultra-pure water. Thus, rinsing may be completed within, for example, half an hour.

The entire cleaning process may therefore be completed with a maximum down-time of the apparatus of only an hour. Cleaning may therefore be carried out more frequently. Frequent cleaning has a benefit that contamination levels can be kept to a very low level at all times. If desired, the cleaning process described herein may be carried out in combination with one or more less frequent cleaning processes which may be off-line, such as mechanical spraying or mega-sonic cleaning techniques. However, a benefit of the use of the cleaning process and/or cleaning liquid described herein is that the frequency of carrying out such an off-line cleaning method may be reduced or such an off-line technique may be eliminated entirely.

In an embodiment, cleaning is carried out in the absence of a substrate. This means that the substrate table WT is exposed to the cleaning liquid. As depicted in FIG. 1, only a part of the substrate table is normally exposed to the immersion space. In an embodiment, the substrate table is therefore moved while the cleaning liquid is within the immersion space in order that different parts of the substrate table are exposed to the cleaning liquid. This enables substantially the entire substrate table to be cleaned. The substrate table may be a source of contaminants. Cleaning without the presence of a substrate may permit the substrate table to cross-contaminate other surfaces of the immersion system. So in an embodiment, the cleaning may be done with the substrate in place on the substrate table, or with a dummy substrate on the substrate table.

Figure 7:
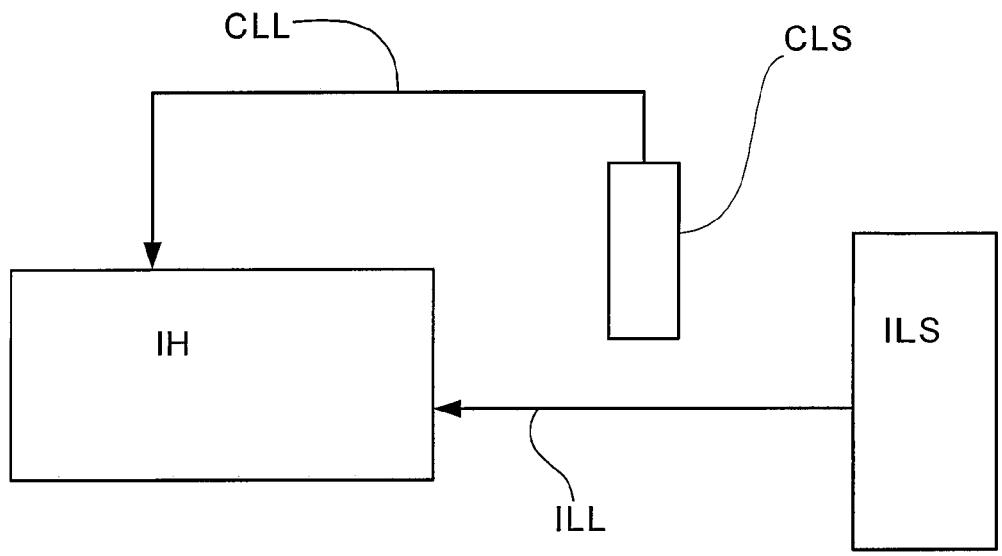
FIG. 7 depicts the supply lines of immersion liquid and cleaning liquid according to an embodiment of the invention.

The cleaning liquid may be supplied to the immersion space using the same inlet system as the immersion liquid, for example inlet IN as depicted FIGS. 2, 3 and 4 or inlet 13 of FIG. 5. In this embodiment, therefore, the cleaning liquid supply system is a part of the immersion liquid supply system. Typically, in this embodiment, cleaning agent may be added to the ultra-pure water of the immersion liquid supply system upstream of its inlet into the immersion space. In an embodiment, depicted in FIG. 7, a separate inlet may be provided so that the cleaning liquid enters the immersion space separately from the immersion liquid. In this embodiment, the immersion liquid is supplied to the immersion hood IH from a source of the immersion liquid ILS via supply line ILL. The cleaning liquid is supplied via an entirely separate supply line CLL from a source of the cleaning liquid CLS. The use of an entirely separate supply line for the cleaning liquid limits the amount of the apparatus which must be rinsed following cleaning. This helps avoid any chance of cleaning liquid deposits occurring in the immersion liquid supply line, and reduces the necessary rinsing time.

Figure 8:
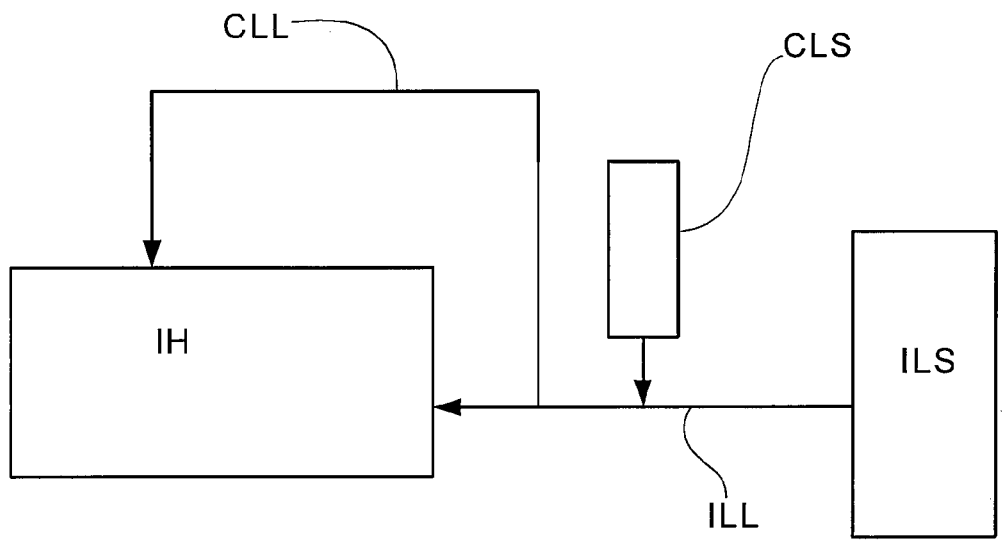
FIG. 8 depicts the supply lines of immersion liquid and cleaning liquid according to an embodiment of the invention.

A further aspect of this embodiment is depicted in FIG. 8. In this aspect, the cleaning liquid is supplied directly to the immersion liquid supply line ILL. However, the supply line ILL splits, providing a separate cleaning liquid inlet to the immersion hood via cleaning liquid supply line CLL. A valve may be used to control whether liquid flows directly to the immersion hood (when filling with immersion liquid or rinsing after cleaning) or whether liquid flows through the cleaning liquid supply line CLL. Rinsing in this embodiment is still reduced since only a small part of the immersion liquid supply line is brought into contact with the cleaning liquid. Further, this embodiment enables a concentrated cleaning liquid supply to be used which can be diluted with ultra-pure water directly from the immersion liquid source ILS. One or more sensors may be provided in the cleaning liquid supply line CLL in order to determine the concentration of the cleaning agent (e.g., $H_2O_2$, $O_2$, $O_3$) in the cleaning liquid.

All the embodiments of the cleaning liquid supply system may have one or more sensors to determine the concentration of the cleaning agent. The sensor(s) may be provided in, for example, one or more of the following locations: the source of the cleaning liquid CLS, the immersion liquid supply line ILL and/or the immersion hood IH. A sensor(s) may alternatively or additionally be located in a liquid removal system configured to remove liquid from the immersion space. If a cleaning liquid supply line CLL is present, one or more sensor may be provided to the cleaning liquid supply line CLL in addition to or instead of a sensor(s) in another part. The sensor(s) may be connected to a controller. The controller may have a processor configured to operate the controller. The controller may operate various valves in the immersion system, for example the valve used to control whether liquid flows directly to the immersion hood IH or through the cleaning liquid supply line CLL. The controller may control the flow of liquids, such as the cleaning liquid and/or ultra-pure water, through the cleaning liquid supply system. The controller may actuate the release of the cleaning agent into a part of the immersion system. So, the controller may be used to determine the concentration of the cleaning agent in the cleaning liquid.

In an embodiment, the cleaning liquid supplied to the immersion space consists of or consists essentially of ozone and ultra-pure water. The ozone is generated in situ within the lithographic apparatus. In situ generation of ozone enables ozone to be made on demand and avoids storage. This therefore has a significant safety advantage. FIG. 9 depicts an embodiment of the ozone generation apparatus. A source of ultra-clean oxygen-containing gas, XCDA, is provided to an ozonizer, if desired via a regulator and/or a restriction to control gas flow. The ultra-clean oxygen-containing gas is typically ultra-clean air, which is optionally supplemented with an increased percentage of oxygen. An inert gas containing oxygen may be used. Nitrogen, argon and helium are examples of suitable inert gases.

The ozonizer itself typically incorporates a UV radiation source, e.g. providing UV radiation having a wavelength of about 220 nm or less, particularly about 190 nm or less (e.g. 193 nm). Irradiation of the oxygen-containing gas causes the formation of ozone in the gas stream and has an advantage that hydrogen is not produced as a by-product. Other state of the art ozonizers may be used, for example an electrochemical ozonizer and/or a corona discharge ozonizer. The thus produced ozone is then passed to a membrane contactor where it is dissolved in ultra-pure water through a permeable membrane. An example of suitable membrane is a PFA membrane (PFA is poly(tetrafluoroethylene-co-perfluoro-(alkyl vinyl ether)) (e.g. Entegris (previously Mykrolis) Phasor II PFA membrane). The membrane provides good contact between the ozone gas flow and the ultra-pure water and typically enables a concentration of up to about 50 ppm ozone to be generated in the water. The ozone concentration can be varied by altering the speed of water flow past the membrane. This may be achieved by operating a controller. Other techniques of controlling the ozone concentration include varying the UV radiation dose or the oxygen concentration in the gas. The gas outlet from the membrane contactor is generally passed through a charcoal filter to remove excess ozone. In an embodiment, the gas outlet is arranged to pass a UV radiation destruction lamp that uses a frequency of about 250 nm, e.g. 254 nm.

Where a further cleaning agent other than ozone is present in the cleaning liquid (e.g. hydrogen peroxide), it may be introduced into the ultra-pure water either before, during or after, desirably after, the liquid passes through the membrane contactor.

The cleaning liquid passes through the immersion hood in order to remove contamination on the surfaces of the immersion space. Used cleaning fluid is then pumped out of the immersion hood into an outlet system, together with, for example, the air and gaseous ozone contained in the immersion hood. The outlet fluid is pumped through a separator which separates the liquid and gas phases. The gas phase is released via an air bleed which is reached after the gas has passed through a charcoal filter to remove ozone. Alternatively or in addition, the ozone may be removed as the gas phase passes under the illumination of a UV radiation destructor lamp. The liquid phase is pumped to a degasser which removes dissolved ozone. Any appropriate type of degasser may be used, for example a membrane-based degasser, an aeration degasser or a column degasser. The liquid which exits the degasser is then drained, while the mixture of air and ozone is mixed with the outlet fluid of the immersion hood before it enters the pump. In this way, the air/ozone can be removed at the separator stage.

The cleaning power of a cleaning liquid of an embodiment of the invention may be increased by UV irradiation of the cleaning liquid. In the case of a cleaning liquid which contains ultra-pure water and oxygen, such irradiation is particularly desired since this will generate ozone in situ in the immersion space. The ozone may also be further activated in the immersion space to provide highly oxidizing species such as the OH radical. In an embodiment in which the cleaning liquid contains hydrogen peroxide and/or ozone, cleaning is highly effective without irradiation. However, UV irradiation may enable, or increase, the formation of the highly oxidizing OH radical and thereby provide improved cleaning effect. For example, the presence of the OH species will provide improved cleaning of carbonized or partly carbonized contaminants in the immersion space.

The UV radiation used may be provided by the projection system of the apparatus, or by a separate UV radiation source such as a low pressure Hg lamp or an excimer laser. An appropriate wavelength is typically about or less than 250 nm. Where ozone is present in the cleaning liquid, a wavelength of less than 220 nm is desired since a wavelength of greater than 220 nm will induce breakdown of ozone to oxygen. In an embodiment, 193 nm wavelength radiation may be used.

Most surfaces, e.g., walls, defining the immersion space can be illuminated directly using UV radiation, for example UV radiation can be projected through the projection system PS used during imaging of a substrate W. Also, much of the top surface of the substrate table WT can be irradiated by moving the substrate table under the projection system PS while the immersion hood 12, IH supplies the liquid and seals it in the immersion space. However, irradiating the underside of the immersion hood IH or liquid supply system 12 is not so easy because there is no direct path from the projection system to the underside of the liquid supply system. As described above, cleaning of the underside, such as in a system which uses the porous member 21 for the removal of liquid, is desirable. In order to address this issue the following method and apparatus is proposed.

In an aspect of the present invention, there is provided a method of irradiating the underside of a liquid supply system positioned around an end of a projection system in an immersion lithographic apparatus, the method comprising: positioning the projection system over a reflector such that a cleaning beam of radiation projected through the projection system onto the reflector is reflected onto an underside of the liquid supply system. Liquid is provided in contact with at least part of the underside. The liquid may the hereinbefore described cleaning liquid. If the liquid supply system comprises a porous member on an underside, the under pressure applied to the porous member may be reduced such that liquid extends over the whole of the porous member such that cleaning of the whole of the porous member may be achieved.

The reflector can reflect different parts of the projection beam at different angles relative to an angle of impingement. For example, the reflector can reflect the projection beam such that it is focused on only the porous member 21, for example or only on an object radially inwardly (relative to the optical axis) of the outer edge of the porous member. In an embodiment, the reflector reflects the projection beam off at least two facets. In that case, a first facet of the at least two facets reflects the beam in a direction with at least a major component radially outwardly and perpendicular to the optical axis. A second of the at least two facets reflects the beam in a direction with at least a major component in a direction parallel to the optical axis towards the underside. The projection system may be the same projection system as is used for focusing a patterned radiation beam onto a substrate during imaging.

The reflector may be positioned on a surface of a substrate table facing the projection system. Often this surface will be a top surface. That substrate table can ordinarily carry a substrate during imaging. The reflector may be moved relative to the projection system during cleaning. The position of the reflector on the surface of the substrate table facing the projection system is a position next to a recess for holding a substrate. Alternatively or additionally, the reflector may be positioned in a recess for holding a substrate during imaging. The positioning may include moving the reflector, in the direction of the optical axis of the projection system, away from and/or towards the projection system. This increases and/or decreases the gap between the underside of the immersion hood 12, IH, and the reflector or substrate table. That moving may occur prior to and/or during positioning. This allows a less sophisticated reflector to be used and the beam of radiation may be only reflected off one surface of the reflector directly to the underside. The reflector may be moved relative to the projection system in a plane substantially perpendicular to the optical axis.

An embodiment of the invention provides a lithographic projection apparatus, comprising: a projection system for projecting a projection beam of radiation onto a substrate; a substrate table for supporting a substrate; a liquid retrieval system for retrieving liquid from a space between the projection system and the substrate table; wherein the substrate table comprises, on a surface facing the projection system, a reflector for reflecting a cleaning beam of radiation projected through the projection system onto an underside of the liquid retrieval system. The reflector may be for use at a distance from the projection system greater than the distance at which the substrate is imaged with the patterned beam of radiation. The reflector may also be for use in the presence of liquid between the underside and the reflector, desirably also between the reflector and the projection system. The lithographic projection apparatus may further comprise a liquid supply system for providing a liquid comprising ultra-pure water and (a) a mixture of hydrogen peroxide and ozone, or (b) hydrogen peroxide at a concentration of up to 10%, or (c) ozone at a concentration of up to 50 ppm, or (d) oxygen at concentration of up to 10 ppm, or (e) any combination selected from (a)-(d). The reflector may be positioned in a recess in a surface of the substrate table facing the projection system in which a substrate lies during imaging of a substrate.

The reflector may be a reflective member for positioning under a projection system of an immersion lithographic projection apparatus, the reflective member comprising: a first facet for reflecting incoming radiation projected through a projection system of the lithographic apparatus to a second facet of the reflective member, which second facet is for reflecting radiation reflected by the first facet back in a direction with at least a major component in the direction of the incoming radiation. In an embodiment, the first facet and second facets are at substantially 90° to each other. The second facet may be formed as part of the same surface as the first facet. The second facet may be formed on a concave surface. That concave surface may be part of the inner surface of a cone (i.e. the surface a cone would make in a material when surrounded by the material). The first facet may also be made by the concave surface. The first facet may be made by a convex surface. In an embodiment, that convex surface is in the form of the surface of a truncated cone. In an embodiment, the convex surface is radially inwardly of the concave surface. In an embodiment, the facet comprises an aluminum or chromium coating. In an embodiment, the reflective member is made of a UV radiation transmissive glass. If the reflective member is made of a UV radiation transmissive glass, the facets may be internal surfaces defined by a layer of reflective material, such as aluminum or chromium. If the reflective member is made of UV radiation transmissive glass, in an embodiment, at least the outer (top) surface of the reflective member is partly covered with a material which reflects or absorbs UV radiation. The parts covered are, in an embodiment, only those parts not above the facets or surfaces.

An embodiment of the present invention provides a reflective member sized for positioning in a recess for a substrate of a substrate table of an immersion lithographic apparatus. The reflective member has a reflective surface which is effective to reflect radiation instant at 90° to the plane of the reflective member radially outwardly. In an embodiment, the reflective member has an etched surface. In an embodiment, that etched surface is coated with a high 193 nm reflective material, for example, aluminum or chromium. In an embodiment, the reflective member reflects incoming radiation off at different angles. In an embodiment, the reflected radiation converges at least partly towards a point.

Figure 10A:
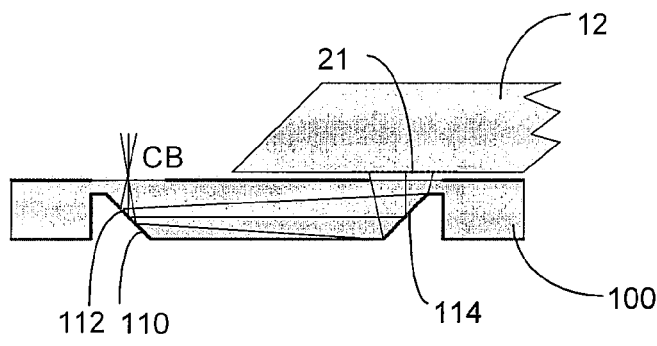
FIGS. 10a-b illustrate an embodiment of a reflective member.

FIG. 10a illustrates an embodiment of a reflective member 100. The member is designed, for example, to be positioned on a substrate table WT at a position next to a recess in which a substrate W is held. The outer (top) surface of the reflective member 100 is, in an embodiment, co-planar with an outer (top) surface of the substrate table WT. This allows the reflective member 100 to be moved under the liquid supply system 12 without turning off the supply of liquid or the leaking of liquid. In that way the immersion space can be kept full of liquid as the reflective member 100 is moved under the projection system PS so that drying of the projection system is avoided. Thus, this reflective member 100 can be used in line (that is the liquid supply system 12 or immersion hood IH does not need to be removed from the apparatus for cleaning). Cleaning fluid is applied to the immersion space and the cleaning liquid extends between the barrier member 12 and the reflective member 100 to a porous member 21. If the under pressure applied to the other side of the porous member 21 is reduced, the meniscus extending between the liquid supply system 12 and the reflective member 100 which defines the outer most edge of liquid moves radially outwardly to the outer edge of the porous member 21. Thus, the cleaning fluid can be arranged to cover all of the porous member 21.

A cleaning beam CB of radiation is then projected through the projection system (which is, for example, the same projection system as used during imaging of a substrate). As can be seen from FIG. 10a, the cleaning beam PB may be focused at the top surface of the reflective member 100 which would also be at the same height as the outer (top) surface of a substrate. The cleaning beam CB is reflected by a first facet 112 (beyond the focusing point of the beam CB) in a substantially radially outwardly direction which is mostly perpendicular to the optical axis towards a second facet 114. The second facet 114 then reflects the cleaning beam CB upwards substantially parallel in direction to the direction of the incoming cleaning beam CB. The radiation reflected by the second facet 114 is thereby directed onto the porous member 21.

The first and second facets 112, 114 are surfaces within the reflective member 100. The reflective member 100 is made of a UV radiation transmissive material such as fused silica. The reflective facets 112, 114 are surfaces within the reflective member 100 covered by a reflective material such as chromium or aluminum (internally or externally). A coating is also provided at least on parts of the outer (top) surface of the reflective member 100. The coating can be absorptive or reflective for the wavelength of the cleaning beam CB. Only parts above the two facets 112, 114 are uncovered to allow the cleaning beam CB to penetrate the reflective member 100. As can most clearly be seen in FIG. 10b, the first and second facets 112, 114 are part of the same surface. The surface is a concave surface 110. The concave surface can be seen as an annulus. The concave surface can be seen as the concave surface of a cone (i.e. the shape of a surface of a material in which a cone has been implanted or the surface a cone would make in a material when surrounded by the material). In this way, as can be seen from FIG. 10b, rotation of the reflective member 100 is not necessary in order to irradiate the whole periphery (which may be circumferential) of the porous member 21.

Figure 10B:
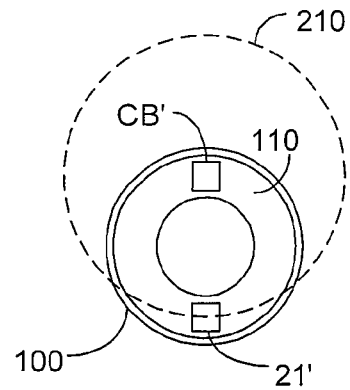

As can be seen from FIG. 10b the cleaning beam CB is applied over an area CB' onto the concave surface 110. The cleaning beam CB is then reflected onto an area on the opposite side of the concave surface 110 onto an area 21' below the porous member 21. In order that all of the area of the porous member 21 is irradiated, the area 21' should cover each part of the porous member 21 during cleaning. This is achieved by moving the reflective member 100 so that all parts of the concave surface 110 are irradiated. In FIG. 10b the width of the porous member 21 has been illustrated in dotted line 210. Thus, by moving the reflective member 100 relative to the projection system PS (and thereby the porous member 21), all areas of the porous member 21 can be irradiated.

Figure 11:
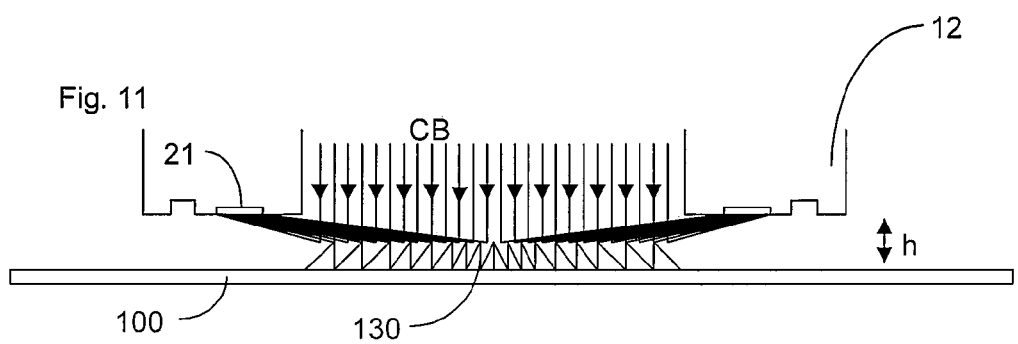
FIG. 11 illustrates a further embodiment of a reflective member.

FIG. 11 shows a further embodiment of reflective member 100. In this embodiment, the reflective member 100 is intended, for example, to be placed in a recess of a substrate table. To this end, the reflective member 100 is made the same size as a substrate so that it fits within a substrate recess of a substrate table. The reflective member may be a substrate with a reflective surface. The outer (top) surface of the reflective member is at least in part profiled 130 so that incoming radiation which impinges on the reflective member 100 at 90° to the plane of the reflective member is reflected with a major component radially outwardly.

In an embodiment, the profile 130 is etched into the top surface of the substrate. A coating, for example of aluminum or chromium, which is reflective to the radiation of the cleaning beam CB, is then applied to produce the reflective member.

In an embodiment, the profile 130 is such that impinging radiation is reflected off at different angles dependent upon where the radiation impinges. In this way, if the cleaning beam is parallel radiation, it can be reflected and focused towards the porous member 21 or another area (e.g., of the underside) of the liquid supply system 12 which is to be cleaned. In an embodiment, the reflective member 100 is moved relative to the projection system. This is effective to reflect radiation at different angles and thereby to clean different parts of the underside of the liquid supply system 12.

The space between the reflective member 100 and the underside of the liquid supply system 12 is small in this embodiment which only allows for a single reflection of the cleaning beam by the reflective member 100. In an embodiment, this increases the height h between the liquid supply system 12 and the reflective member 100 beyond that which would be present during imaging of a substrate. The reflective member and/or projection system may be moved by one or more actuators. Because there is less movement between the reflective member 100 and the liquid supply system 12 even with increased height h, the liquid confinement structure 12 is unlikely to leak.

Figure 12:
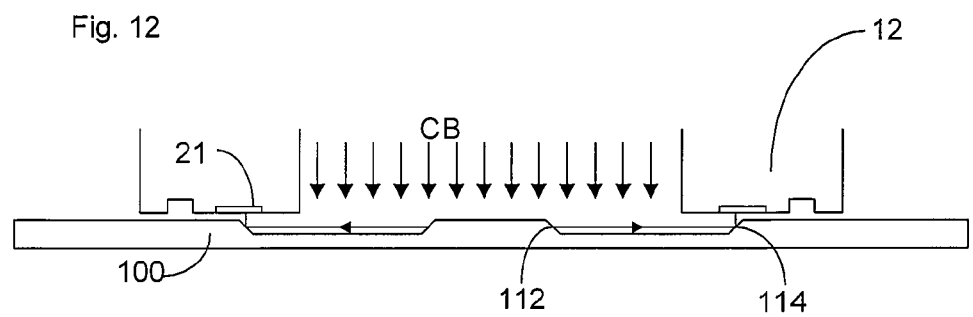
FIG. 12 illustrates a further embodiment of a reflective member.

A further embodiment is illustrated in FIG. 12. In this embodiment the reflective member 100 is also intended, for example, to replace a substrate W on a substrate table WT. This embodiment also comprises two first and second facets 112, 114 as in the embodiment of FIGS. 10a-b. However, in this embodiment, the second facet 114 is provided by a concave surface similar to that of the embodiment of FIGS. 10a-b. However, the first facet 112 is provided by the surface of a truncated cone (i.e. a concave surface). Thus, incoming cleaning radiation CB is reflected by the first facet in a direction substantially perpendicular to the direction of incoming radiation (and parallel to the plane of the reflective member 100) to the second facet 114. Radiation CB is reflected from the second facet 114 towards the underside of the liquid supply system 12 (e.g., towards the porous member 21). At least the first and second facets of the reflective member 100 of this embodiment are reflective or have a reflective coating. Other parts of the reflective member 100 may either be reflective or absorptive depending upon the desired effect to be achieved.

Features of each of the embodiments herein may be combined with features of one or more of the other embodiments, as appropriate.

As will be appreciated, although an embodiment of the present invention has been described in particular in relation to cleaning a porous member 21 of a liquid supply system 12 or immersion hood IH, the same techniques can be used for cleaning other features of the underside of a liquid supply system 12 (or so-called liquid containment system or immersion hood) with or without the presence of a porous member 21 or equivalent member (e.g. porous member). Furthermore, these techniques can be used in combination with other techniques to irradiate other parts of an immersion system for cleaning using an embodiment of the invention.

The cleaning solutions are supplied by an in-line cleaning system. The cleaning system may be mainly or wholly located in a single cleaning cabinet. The cleaning system may be a point source dispenser. The cleaning system is operable by controller to supply the cleaning fluid to immersion system when required.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of one or more computer programs containing one or more sequences of machine-readable instructions describing a method as disclosed above, or a data storage medium (e.g. semiconductor memory, magnetic or optical disk) having such a computer program stored therein. At least one controller may be provided to control the apparatus. Each controller may operate at least a component of the apparatus according to the one or more of the computer programs embodying the invention.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid, i.e. a leaky confinement immersion system.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used, although they should be considered more generically. It is intended that such terms should also extend to other high refractive index liquids which may be used, such as fluorine containing hydrocarbons.

The descriptions above are intended to be illustrative, not limiting. Thus, it will be apparent to one skilled in the art that modifications may be made to the invention as described without departing from the scope of the claims set out below.

The invention claimed is:

1. An immersion type lithographic apparatus comprising:
an immersion system configured to at least partially fill an immersion space with an immersion liquid;
a cleaning liquid supply system configured to provide a cleaning liquid to the immersion space; and
a cleaning liquid which is contained in the immersion space and/or in the cleaning liquid supply system;
wherein the cleaning liquid consists essentially of ultra-pure water containing a mixture of hydrogen peroxide having a concentration selected from 0.1 ppm to 10 ppm and ozone having a concentration selected from 0.1 ppm to 20 ppm.

2. The apparatus of claim 1, wherein the cleaning liquid consists essentially of ultra-pure water containing the mixture of hydrogen peroxide and ozone, such that the ozone has a concentration of about 10 ppm and the hydrogen peroxide has a concentration of about 2 ppm.

3. The apparatus of claim 1, further comprising a source of UV radiation configured to project a beam of UV radiation onto the cleaning liquid while the cleaning liquid is within the immersion space or within the cleaning liquid supply system.

4. The apparatus of claim 1, wherein the immersion space comprises a first inlet system connected to a source of immersion liquid to provide immersion liquid to the immersion space, and a second inlet system connected to the cleaning liquid supply system to provide cleaning liquid to the immersion space.

5. A method for preventing or reducing contamination in an immersion type lithographic apparatus, the apparatus comprising an immersion system configured to at least partially fill an immersion space with an immersion liquid, the method comprising supplying a cleaning liquid to the immersion space, wherein the cleaning liquid consists essentially of ultra-pure water containing a mixture of hydrogen peroxide having a concentration selected from 0.1 ppm to 10 ppm and ozone having a concentration selected from 0.1 ppm to 20 ppm.

6. The method of claim 5, further comprising irradiating the cleaning liquid with UV radiation.

7. The method of claim 5, wherein the immersion space is rinsed with the cleaning liquid.

8. The method of claim 7, wherein the immersion space is subsequently rinsed with ultra-pure water.

9. The method of claim 5, wherein the apparatus further comprises a substrate table configured to hold a substrate, the substrate table being partially exposed to the immersion space, and wherein the method further comprises moving the substrate table such that different parts of the substrate table are exposed to the cleaning liquid contained within the immersion space.

10. The method of claim 5 which is a device manufacturing method further comprising at least partially filling the immersion space with the immersion liquid and projecting a patterned beam of radiation through the immersion liquid onto a substrate, wherein supplying the cleaning liquid supply may be carried out before and/or after projecting the patterned beam of radiation.

11. The method of claim 10, wherein the immersion liquid is supplied to the immersion space via a first inlet system and the cleaning liquid is supplied to the immersion space via a second inlet system.

12. The method of claim 5, wherein the cleaning liquid consists essentially of ultra-pure water containing the mixture of hydrogen peroxide and ozone, such that the ozone has a concentration of about 10 ppm and the hydrogen peroxide has a concentration of about 2 ppm.

\* \* \* \* \*